United States Patent [19]

Logan et al.

[11] Patent Number: 4,526,011
[45] Date of Patent: Jul. 2, 1985

[54] DEW POINT SENSITIVE COMPUTER COOLING SYSTEM

[75] Inventors: Max C. Logan, Maplewood; Jon T. Nordstrom, Forrest Lake, both of Minn.

[73] Assignee: Control Data Corporation, Minneapolis, Minn.

[21] Appl. No.: 471,953

[22] Filed: Mar. 3, 1983

[51] Int. Cl.³ .................... B21D 28/00; F25D 17/04
[52] U.S. Cl. .................... 62/176.1; 340/602; 374/20; 374/28
[58] Field of Search ............ 340/583, 602; 62/176.1, 62/176.2, 176.3, 190; 236/44 C, 44 R, 44 A; 374/28, 17–20

[56] References Cited

U.S. PATENT DOCUMENTS

| | | | |
|---|---|---|---|
| 1,960,658 | 5/1934 | Brace | 62/176.1 |
| 2,286,551 | 6/1942 | Kingsland | 236/44 |
| 2,974,870 | 3/1961 | Pitts | 236/44 |
| 3,599,862 | 1/1971 | Hogan et al. | 236/44 C |
| 3,859,616 | 1/1975 | Ladany | 337/300 |
| 3,926,052 | 12/1975 | Bechtel | 73/336.5 |
| 3,999,706 | 12/1976 | Lewis | 236/44 C |
| 4,105,063 | 8/1981 | Bergt | 165/21 |
| 4,259,565 | 3/1981 | Ogino et al. | 219/216 |
| 4,350,023 | 9/1982 | Kuwabara et al. | 62/176 E |

OTHER PUBLICATIONS

Optron, Inc., Type OPB 703 Reflective Object Sensor, Bulletin No. 1042, Feb., 1975.

General Eastern Model 455% RH & Temperature Transmitter Specifications (undated).

Primary Examiner—William E. Wayner
Attorney, Agent, or Firm—Edward P. Heller, III; Joseph A. Genovese

[57] ABSTRACT

A computer cooling system has a mixing valve which supplies coolant to the computer and receives hot return coolant from the computer and also chilled return coolant from a chiller intermediate the computer and the mixing valve. The mixing valve mixes the hot return coolant with the chilled return coolant to adjust the cooling system temperature. Control circuitry senses, or estimates, the dew point temperature of the computer room environment, compares it with the cooling system temperature, and adjusts the mixing valve to maintain the cooling system temperature a few degrees above the dew point temperature. A condensation sensor comprised of a light emitting diode (LED), reflective tape applied about a cooling system supply conduit, and a phototransistor is disclosed. Light from the LED is fully reflected by the reflective tape to the phototransistor in dry conditions, but only partially reflected when condensation forms on the tape. The phototransistor output drops when condensation impedes the reflectability of the tape resulting in only partial reflection of the light and this drop in the phototransistor output is sensed by circuitry associated therewith to shut down the coolant pump and the computer system.

4 Claims, 5 Drawing Figures

DEW POINT SENSITIVE COMPUTER COOLING SYSTEM

BACKGROUND

The invention relates to cooling systems for computers, and particularly, to a cooling system designed to prevent condensation within the computer.

It has been customary among at least some computer manufacturers to generally assume a 56° F. dew point (or other designated temperature) in the computer room environment, and to shut down the system when the room, or individual computer cabinets, reach 56° or 57°. Accordingly, users of these computer systems have been required to maintain the computer rooms at least above the 56° F. estimated dew point temperature 24 hours a day, 7 days a week.

With the increasing costs of energy, however, many users want to relax the computer room environmental controls on weekends and at other times, and also to lower building temperatures in winter and relax air conditioning in the summer to reduce their escalating heating and cooling costs.

The problem presented has been to enable users to relax their environmental computer room controls while still preventing condensation within the computers.

SUMMARY

The present invention solves the problems presented by the prior systems by providing a cooling system which monitors dew point temperature (or estimates it based on temperature and relative humidity readings) and maintains the cooling system temperature a few degrees above the dew point temperature.

Accordingly, when the dew point temperature drops, the temperature of the computer room can also be reduced to save energy and allow the computer to run cooler and more efficiently. In addition to saving energy, electronic chips run more efficiently at cooler temperatures and also their useful lives are increased by operating at cooler temperatures. Conversely, when the dew point temperature increases, the temperature of the coolant system is increased to avoid the possibility of condensation within the computer.

A condensation sensor is disclosed which senses the formation of condensation on the cooling system supply conduits and shuts the cooling system off in response thereto to prevent further condensation within the computer.

It is therefore an object of the present invention to provide an improved cooling system for a computer.

It is another object to provide a cooling system which senses or estimates the computer room environment dew point temperature and maintains the cooling system temperature at a few degrees above the dew point temperature.

Yet another object is to provide a cooling system which includes a condensation sensor which senses the presence of condensation on the cooling system conduits and shuts down the system in response thereto.

Still another object is to provide a computer cooling system wherein the computer room environment relative humidity and temperature values are used to estimate dew point and to maintain the cooling system a few degrees above the estimated dew point temperature.

Still another object is to provide a computer cooling system wherein the cooling system temperature value is compared with a dew point temperature value and an error signal is generated to open or close the cooling system mixing valve to mix in more or less chilled return water as necessary to maintain the cooling system temperature a few degrees above dew point.

Still another object is to provide a cooling system wherein the opening or closing of the mixing valve to vary system temperature in response to dew point system temperature comparisons is damped to prevent the system from overshooting.

Still another object is to provide a computer cooling system which is switchable between an automatic mode and a manual mode, and wherein in the manual mode an adjustable temperature setting mechanism is used to set the system temperature, whereas in the automatic mode the same temperature setting mechanism can be used to set the minimum cooling system temperature.

Still another object is to provide a condensation sensor which employs a light source operably disposed with respect to a reflective surface and a light sensing device so that light from the source is fully reflected to the sensing device in dry conditions, but only partially reflected when condensation forms on the reflective surface, and wherein the sensor shuts down the system where the light is only partially reflected due to condensation.

These and other objects, advantages and novel features of the invention will become apparent from the following detailed description of the invention taken in conjunction with the accompanying drawings.

DESCRIPTION OF THE PREFERRED EMBODIMENT

The invention comprises a cooling system for a computer which monitors the dew point temperature of the computer room environment and maintains the cooling system temperature a few degrees above the dew point temperature. The invention also includes a condensation sensor employed in the cooling system to shut the system down whenever condensation forms within the system.

Figure 1:
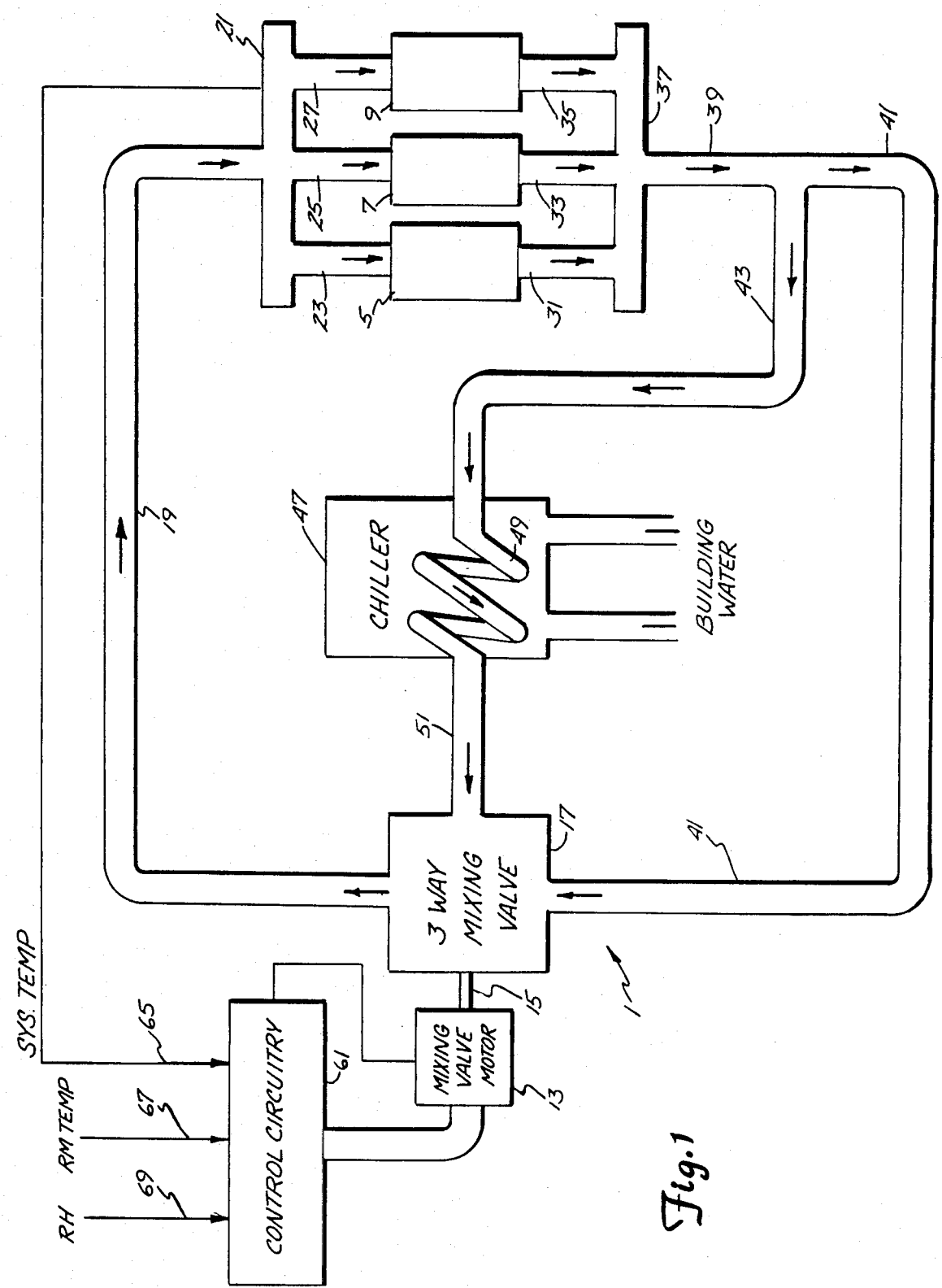
FIG. 1 is a block diagram of the invention.

In FIG. 1, the computer sections cooled by the cooling system 1 are designated by the numerals 5, 7, and 9. The system 1 includes a dual winding mixing valve motor 13 which drives a three-way mixing valve 17 in the open or closed direction by means of a motor shaft 15. Coolant is supplied by mixing valve 17 to the computer sections 5, 7, and 9 via main coolant supply conduit 19, supply manifold 21 and section supply conduits 23, 25, and 27. The coolant cools the computer sections 5, 7, and 9 and then exits the sections as hot coolant via section return conduits 31, 33, and 35. The hot coolant is collected in a hot coolant return manifold 37 and then passes into main coolant return conduit 39. Return conduit 39 splits into a first branch 41 and a second branch 43. First branch 41 supplies hot return coolant to mixing valve 17. Second branch 43 sends hot coolant through the system chiller 47 via a heat exchange coil 49. The hot coolant gives up its heat in the coil 49 to the circulating chilled building water in the chiller 47 and then passes to mixing valve 17 via conduit 51 as chilled return coolant. Mixing valve 17 is controlled by motor 13 to mix the proper amount of chilled return coolant with hot return coolant to provide the proper temperature coolant to supply conduit 19. For example, when motor 13 drives mixing valve 17 fully open, hot return conduit 41 is shut off and only chilled coolant is supplied to conduit 19. On the other hand, when motor 13 drives mixing valve 17 fully closed, chilled return conduit 51 is shut off and only hot coolant through conduit 41 is supplied to conduit 19. Intermediate to these fully closed and fully open positions, the valve 17 mixes the hot return coolant with the chilled return coolant to achieve the proper supply coolant temperature.

According to the invention, a control circuit 61 is provided which determines or estimates the dew point temperature of the computer room environment and compares that temperature to the temperature of the coolant at the coolant supply manifold 21. Based on this comparison, control circuitry 61 sends appropriate signals to mixing valve motor 13 to adjust the valve 17 as necessary to reduce or increase the temperature of the coolant so that the coolant system temperature at supply manifold 21 is maintained a few degrees above the dew point temperature. The coolant system temperature is sensed at the coolant supply manifold 21 by a 100K thermistor (not shown). The manifold 21 is believed to be the coldest part of the cooling system. By maintaining the coldest part of the cooling system a few degrees above dew point, condensation within the remainder of the system is avoided FIG. 1 shows system temperature input 65 to control circuitry 61 from the manifold 21. In addition, a room temperature input 67 and a relative humidity input 69 are shown. As will be explained more fully later on in the description, in the presently preferred embodiment of the invention, dew point temperature is estimated from these temperature and humidity inputs 67 and 69. It is to be understood however that the invention also covers a system wherein the dew point temperature is determined directly by a commercially available meter (such as is provided by the General Eastern Instruments Corporation, Watertown, Mass.) and then input directly into the control circuitry 21 for comparison with the cooling system temperature.

Figure 2:
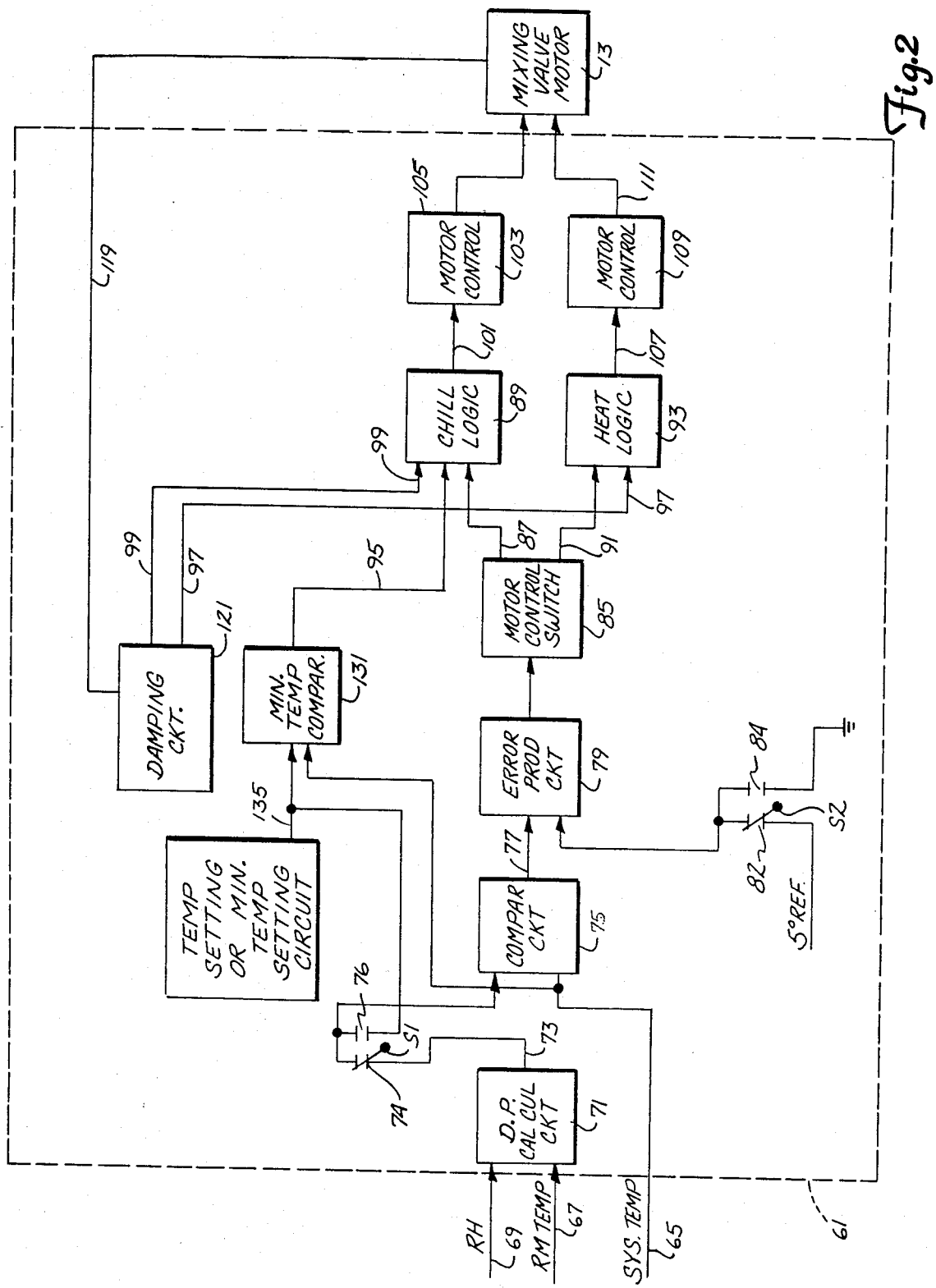
FIG. 2 is a block diagram of the control circuitry of the invention.

Reference is now made to FIG. 2 wherein a functional block diagram of the basic control circuitry 61 is disclosed. The cooling system temperature input 65 as well as the room temperature input 67 and relative humidity input 69 are input to controlled circuitry 61 from the left in FIG. 2. Control circuitry 61 has two modes of operation: an automatic mode and a manual mode. In the automatic mode switches S1 and S2 are rotated counterclockwise to close contacts 74 and 82. This is the automatic position. In the manual mode, switches S1 and S2 are rotated clockwise to close contacts 76 and 84, respectively. This is the manual position. Control circuit 61 will first be described as it operates in the automatic mode and will then be described as it operates in the manual mode.

In the automatic mode, the room temperature input 67 and relative humidity input 69 are converted by dew point calculating circuit 71 to an estimate of the dew point temperature based on an emperically derived formula which will be later disclosed. This estimated dew point temperature is input to comparator circuit 75 via output 73. Comparator circuit 75 compares the dew point temperature input 75 with the system temperature input 65 and determines a temperature differential value which it sends to the error producing amplifier 79 via output 77. A reference value, here 5° F. is also input into error producing amplifier 79 via input 81 and contacts 82 of switch S2. The amplifier 79 compares the temperature differential value 77 with the reference value 81. If the temperature differential is more than the reference value, then amplifier 79 outputs a first type of error signal indicating that the system temperature is more than 5° F. above the dew point temperature. If, on the other hand, temperature differential 77 is less than reference value 81, amplifier 71 will output a second type of error signal indicating that the system temperature is less than 5° F. above dew point. These first or second type error signals are output to motor control switch 85 which provides a digital high-level signal to chill logic 89 via output 87 in the case of a first type error signal, or alternatively, a digital high-level signal to the heat logic 93 via output 91 in the case of a second type error signal. Ignoring for the moment the optional inputs 95 and 97 to chill logic 89, and the optional input 99 to heat logic 93, chill logic 89 turns on motor control circuit 103 via output 101 in response to a high-level signal on input 87. Motor control circuit 103, in turn, drives the mixing valve motor via output 105 in the open direction to mix in more chilled water and reduce the system coolant temperature for so long as it is enabled by chill logic 89. Conversely, heat logic 93 turns on motor control 109 via output 107 in response to a high-level signal on input 91. Motor control 109, in turn, drives mixing drive motor 13 in the close direction via output 111 for so long as it is enabled by heat logic 93 to mix in more hot return coolant to raise the system coolant temperature. Hence, in the simplest form of the system, where the system temperature is more than 5° greater than the dewpoint temperature, control circuitry 61 opens mixing valve 17 to lower the system cooling temperature; and where the coolant temperature is less than 5° above dew point, the circuitry 61 closes mixing valve 17 to heat up the system coolant temperature. Accordingly, circuitry 61 continuously maintains the system coolant temperature at approximately 5° F. above the dew point temperature.

Having described the simplest form of the control circuitry 61 as it functions in the automatic mode, certain optional enhancements of the system will now be described. As shown in FIG. 2, the circuitry 61 includes a damping circuit 121. The purpose of damping circuit 121 is to damp system response to minimize the oscillation of the system about the 5° F. above dew point reference temperature. Damping circuit 121 includes a timing capacitor (later described) which is charged by input 119 as soon as the motor 13 begins to turn in either the open or the closed direction. Once the motor has continuously turned in either the open or closed direction for a sufficient period of time to charge the timing capacitor, damping circuit 121 outputs a low-level signal via either its output 97 or 99 (97 if the motor has been turning in the open direction, 99 if the motor has been turning in the closed direction) to chill logic 89 or heat logic 93 to shut off the motor 13. The motor 13 is then disabled until the timing capacitor discharges. Once the capacitor has discharged, a high-level enabling signal is again presented by damping circuit 121 to the chill logic 89 or heat logic 93 via conductors 97 or 99, respectively. Damping circuit 121 thus causes the mixing valve 13 to open or close in a stepped manner to give the cooling system time to respond to the changing mixture of chilled and hot return coolant before completely opening or closing the mixing valve. This dampening of the mixing valve motion prevents the system from overshooting its mark and continually hunting about the 5° F. above dew point reference temperature.

The other input to chill logic 89 which was formerly ignored was input 95. A minimum temperature setting circuit 133 includes a dial and scale (not shown) which permits the user to set a minimum temperature value for the system. This minimum temperature value is output to a minimum temperature comparator 131 via output 135 where it is compared with the cooling system temperature value 65. So long as system temperature 65 is above the minimum temperature setting 135, comparator 131 outputs a high-level enabling signal via its output 95 to chill logic 89. If, however, the system temperture 65 falls below the minimum temperature setting 135, comparator 131 outputs a low-level signal which disables chill logic 89 until the system temperature has risen above the minimum temperature setting.

Having described the basic and enhanced versions of the automatic mode, the operation of circuit 61 in the manual mode is now described.

As noted previously, in the manual mode switches S1 and S2 are rotated counterclockwise in FIG. 2 to close contact 76 and 84 and open contacts 74 and 82. With contact 76 closed, the output 135 of temperature setting circuit 133 passes through the contact 76 and is input to comparator circuit 75 where it is compared with the system temperature 65. Comparator circuit 75 determines the temperature differential between setting 135 and system temperature 65 and outputs this differential value to error producing circuit 79. Since contacts 84 are now closed by S2, a ground potential signal is input to the error producing circuit 79. Accordingly, the temperature differential value output by comparator circuit 75 will be compared to ground potential. If the system temperature is greater than the temperature setting at circuit 133, than a positive differential value will be compared with ground and a first type error signal will be output enabling the chill logic (assuming the two conditions previously discussed are met) and opening the mixture valve to reduce system temperature. If however, system temperature 65 is below the set temperature value 135, then comparator circuitry 75 will output a negative differential value which will be compared with ground and error producing circuit 79 to generate a second type error signal. The second type error signal will enable the heat logic (assuming the condition previously mentioned is met) to close down the mixing valve to increase system temperature.

Hence, the temperature value set at the circuitry 135 is utilized to set the minimum system temperature in the automatic mode and used to set the system coolant temperature at the supply manifold 21 in the manual mode.

Having described both the automatic and manual modes, control circuitry 61 will now be explained in more detail with reference to the circuit diagram shown in FIG. 3.

Figure 3:
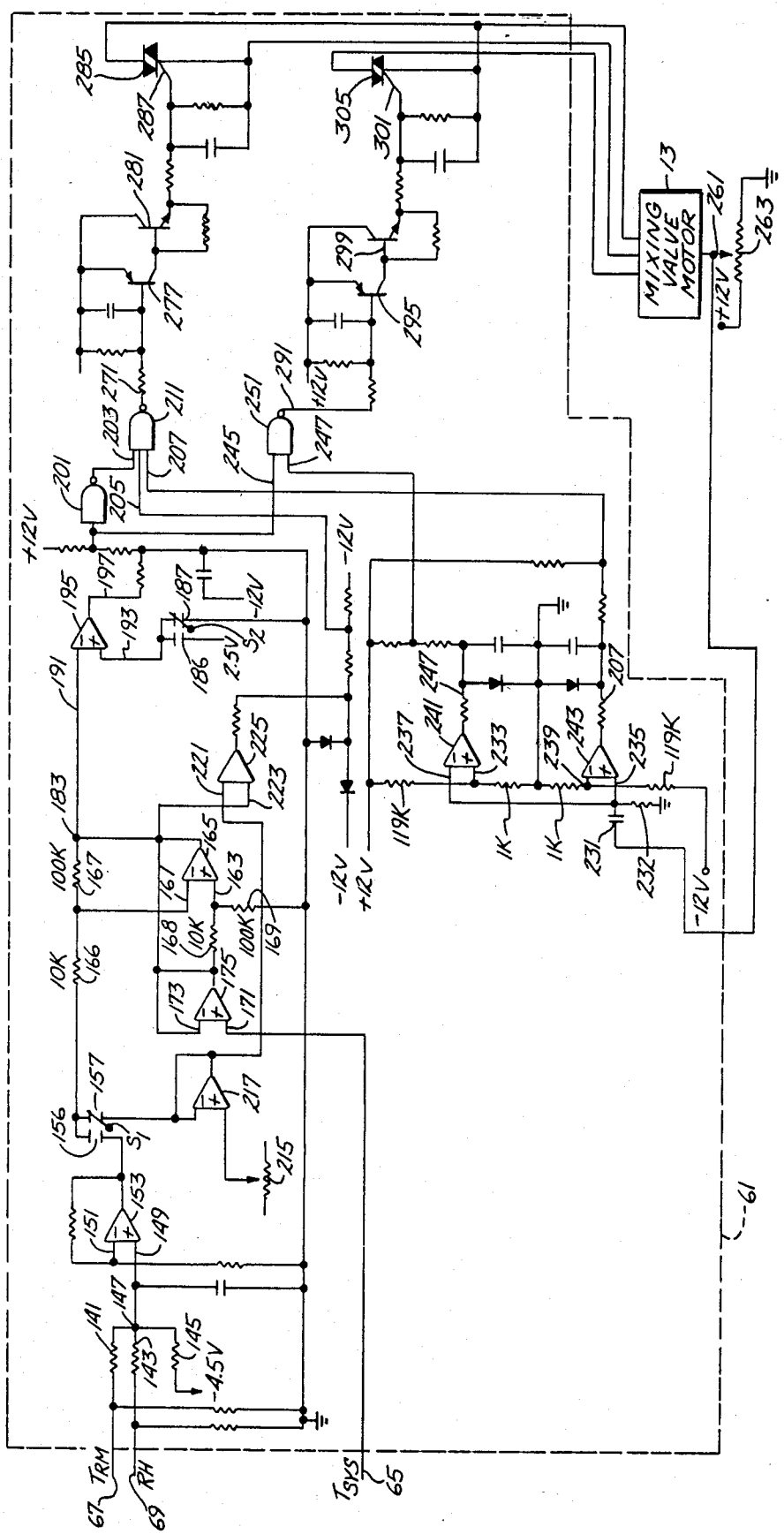
FIG. 3 is a circuit diagram of the control circuitry.

The room temperature "T" and the relative humidity "RH" inputs 67 and 69, which are input from the left in FIG. 3, are obtained from a General Eastern Model 411 RH and Temperature Sensor. The temperature input T is scaled from 0 volts to 5 volts for 0° F. to 100° F. Thus, input T, or $V_T$, is scaled at 0.05 volts/°F. over the range of interest (50° F.–90° F.). The RH input is scaled from 0 volts to 5 volts for 0% to 100% humidity. Hence, the input RH, or $V_{RH}$, is scaled for 0.05 V/% RH over the range of interest (30%–70%). The $V_T$ value passes through a 10K resistor 141 to node 147, while the $V_{RH}$ value passes through a 24K resistor 143 to node 147. A minus 4.5 volt reference value also passes through a 24K resistor 145 to node 147. Given this resistor network and these inputs, the voltage at node 147, or the dew point temp voltage $V_{DPT}$, is given by the formula:

$$V_{DPT} = V_T + (V_{RH} - 4.5)/2.4$$

The above formula has been empirically derived by the applicants herein as an approximation of dew point temperature for the typical range of temperature and relative humidity values which a computer room environment will be likely to experience. The formula estimates the corresponding dew point readings for the temperature and humidity values selected as determined from a psychrometric chart. The calculated dew point value represented by the voltage at node 147 is the noninverting input 149 to amplifier 153. Note that where a relative humidity sensor is used (such as could be obtained from the General Eastern Instruments Corporation as previously noted) the dew point temperature reading would be input directly to this node 147. The inverting input 151 to amplifier 153 is grounded. The 141, 143, 145 resistor network reduces the signal level of $V_{DPT}$, so amplifier 153 amplifies $V_{DPT}$ to the 0.05 V/°F. scaling. The $V_{DPT}$ value passes through contacts 156 and becomes the inverting input 161 to power amplifier 165. The cooling system temperature comprises the noninverting input 163 to amplifier 165 as follows: The system temperature taken at the coolant supply manifold 21 is scaled from 0 volts to 5 volts for 0° F. to 100° F. and then input via conductor 65 to circuitry 61 as the noninverting input 171 to power amplifier 175. The cooling system temperature value is amplified by amplifier 175 and comprises the noninverting input 163 to amplifier 165. Amplifier 165 subtracts the dew point temperature value on pin 161 from the system temperature value on pin 165 to determine a temperature differential value which is amplified by amplifier 165 and multiplied by 10 due to the paired 10K and 100K resistors 166, 167 and 168, 169. The gain of 10 of amplifier 165 increases the scaling of the signal at node 183 form 0.05 volts/°F. to 0.5 volts/°F., or 2° F./volt. This scaled temperature differential value is then input on the inverting input 191 of comparator 195. The noninverting input 193 is a plus 2.5 volt reference level, or 5° F. on the 2° F./volt scale Comparator 195 has a low output whenever the temperature differential value on pin 191 exceeds the 2.5 volt signal on pin 193. This is a first type error signal. Conversely, comparator 195 has a high output 197 whenever the temperature differential value on pin 191 is below the 2.5 volt reference. This is a second type error signal. Where the temperature differential is greater than the 2.5 volt reference, the low output produced by the comparator 195 is inverted by NAND gate 201 to become an enabling high input to the chill NAND gate 211. Where the differential temperature value is below the 2.5 volt reference, the high output produced by comparator 195 comprises an enabling high input 245 to the heat NAND gate 251.

As shown in FIG. 3, there are two optional inputs to NAND 211 which must be high before NAND 211 is fully enabled to energize the motor control circuit to drive the mixing valve in the open direction.

The first of these is input 205. Input 205 is high when the system temperature exceeds the minimum temperature set by potentionmeter 215 as follows: Potentionmeter 215 has a degrees F. calibrated scale so that the user can set a temperature (at a dial not shown) which will then be scaled to the appropriate voltage for the circuit. The temperature value set at potentionmeter 215 is amplified at amplifier 217 and input on the inverting input 221 to comparator 225. The noninverting input 223 comprises the cooling system temperature value produced by amplifier 175. Comparator 225 compares the minimum temperature setting 221 with the system temperature 223 and if the system temperature exceeds the minimum temperature, a high is output from comparator 225 to enable chill NAND input 205. If, however, the minimum temperature exceeds the system temperature, then the output of comparator 225 will go low to disable the chill NAND 211. Hence, input 205 ensures that the system temperature remains above a minimum temperature which can be set at potentionmeter 215.

Input 207 comprises the final enabling input to chill NAND 211. Input 207 comprises one output of the system dampening circuit, the other dampening circuit output 247 goes to the heat NAND 251. Capacitor 231 and resistor 232 set up the timing for the dampening circuit. In the preferred embodiment we have chosen a 10K resistor and 50 microforad (or greater) capacitor to achieve a suitable discharge rate for capacitor 231. As long as the capacitor is discharged, the output 207 of comparator 243 and output 247 of comparator 241 remain high to enable their respective NAND GATES 211, 251. The positive side of capacitor 231 is connected to a wiper arm 261 which moves with the mixing valve motor shaft. The wiper arm moves from ground potential to plus 12 volts on potentionmeter 263 as the valve moves from its fully closed to its fully opened position. Assuming that we start with the valve fully opened, the wiper starts at ground and the positive side of capacitor 231 would also be at ground potential. We assume that the negative side of capacitor 231 has discharged through resistor 232 to ground. As the motor turns to close the valve, the wiper 261 moves towards plus 12 volts and capacitor 231 begins to charge. Once the negative side of capacitor 231 has charged from 0 volts to above 0.1 volts, inverting pin 237 to comparator 241 also goes to above 0.1 volts. With pin 237 above 0.1 volts, it is higher than the positive 0.1 volt reference applied to noninverting pin 233 and the output 247 of capacitor 241 goes low to disable the heat NAND 251. The positive 0.1 volt reference is supplied by the 119K:1K resistor divider network between the +12 volt reference and ground. Once NAND 251 is disabled the motor control circuitry (later described) is also disabled and the motor shuts down. With the motor shut down, the positive side of capacitor 231 remains at a fixed voltage point of potentionmeter 263 and the negative side discharges to ground in accordance with the discharge rate set up by capacitor 231 and resistor 232. Once capacitor 231 has discharged, the output of capacitor 241 again goes high to enable heat NAND gate 251. Note that with pin 241 high, common pin 235 is high also, so that the output of amplifier 243 goes high to enable chill NAND 211. Since we are in a heating node, however, input 203 to NAND 211 will be disabled.

If we assume that the motor is opening the valve, and that the wiper 251 starts at 10 volts, as the valve opens and the wiper arm moves towards ground, the capacitor will again begin to charge. Once the negative side of the capacitor goes more than 0.1 volts negative, noninverting input 235 will become more negative than the minus 0.1 volt reference of inverting input 239 and the output 207 of comparator 235 will go low disabling chill NAND 211. The minus 0.1 volt reference is supplied to pin 239 by the 119K:1K voltage divider network set up between the −12 volt reference and ground. With the motor stopped, capacitor 231 will discharge causing the output 207 of comparator 243 to go high again to re-enable NAND gate 211.

Hence, the dampening circuitry just described, by virture principally of timing capacitor 231, damps the motion of the valve causing it to open or close in small steps. In this way, motor 13 is prevented from overshooting and continually hunting for the 5° F. plus dew point reference value.

Assuming then that the three inputs 203, 205, and 207, to NAND 211 are enabled, the output of NAND 211 goes low to provide a base current to transistor 277 to turn it "on". Transistor 277 in turn applies a base current to transistor 281 to turn "it on" and transistor 281 in response provides an enabling current to the GATE 287 of triac 285 to turn the triac 285 "on". With triac 285 turned "on" current is provided to mixing valve motor 13 to drive the mixing valve 17 in the open direction.

Likewise, when both inputs 245 and 247 to heat NAND 251 are high, its output 291 goes low which turns on transistors 295, 299, which in turn supply current to gate 301, switching triac 305 "on" to activate the motor 13 to drive mixing valve 17 in the closed direction.

As explained previously, the valve will continue to open for so long as all the three inputs 203, 205 and 207 to gate 211 are enabled. Likewise the valve will continue to close for so long as both inputs 245 and 207 to gate 251 are enabled.

Throughout the foregoing description of FIG. 3 switches S1 and S2 had been rotated counterclockwise to their automatic position to close contacts 156 and 186. The operation of the circuit diagram of FIG. 3 will now be described with switches S1 and S2 rotated clockwise to the manual position wherein contacts 157 and 187 are closed.

By closing contacts 157, the temperature value set at potentionmeter 215 passes through amplifier 217 and is input on inverting pin 161 of amplifier 165. The system temperature value 65 is amplified at amplifier 175 and present at noninverting pin 163. Amplifier 165 compares the temperature values set at potentionmeter 215 with the system temperature value and outputs the difference to comparator 195 inverting pin 191. This differential value output by amplifier 165 is scaled to 2° F./volt. Since switch S2 is now in the manual position wherein contacts 186 are closed, noninverting pin 193 of comparator 195 is grounded. Hence, the temperature differential value generated by amplifier 165 is compared to ground potential. If it is more positive than ground potential (which would indicate that the system temperature is above the potentionmeter temperature setting) than the output of comparator 197 will be low which will enable input 203 to chill NAND gate 211 to reduce system temperature. If, on the other hand, the differential value on pin 191 is more negative than ground potential (indicating that the system temperature is below the potentionmeter setting) than the output of comparator 195 will be high and will enable the heat NAND gate 251 to increase the system temperature to bring in line with the temperature set at the potentionmeter 215. Hence, whereas in the automatic mode potentionmeter 215 is used to set the minimum system temperature, in the manual mode the potentionmeter setting 215 is used to set the desired system temperature.

Having described the basic structure and operation of the cooling system, the highly inventive condensation sensor is now described.

Figure 4:
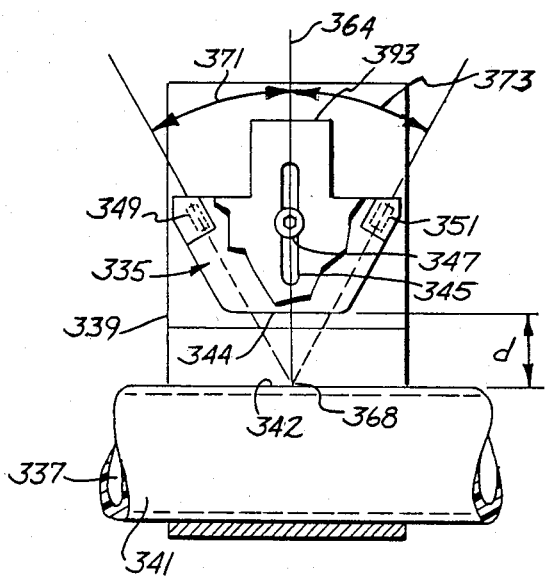
FIG. 4 is an elevational view of the condensation sensor of the present invention.
Figure 5:
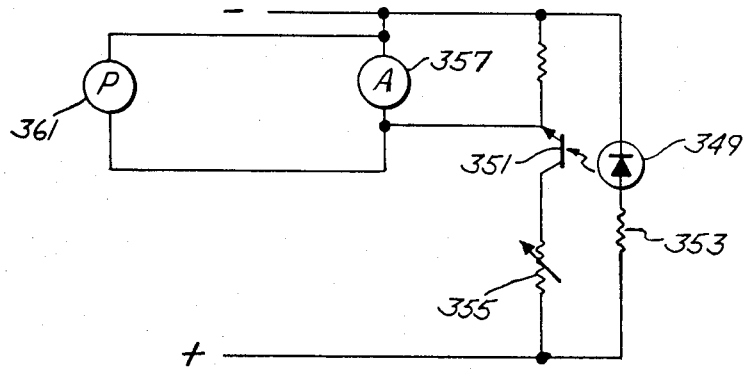
FIG. 5 is a circuit diagram of the condensation sensor circuitry of the present invention.

The condensation sensor 335 is shown in FIGS. 4 and 5. As shown in FIG. 4, the sensor 335 is mounted on a coolant system pipe 337 by means of a bracket 339 which is secured to the pipe 337. Sensor 335 has a housing 343 having an oblong slot 345. A bolt 347 extends through slot 345 from bracket 339 to secure housing 343 to the bracket 339. The bolt 347 can be loosened to adjust the sensor housing 343 vertically. Pipe 337 is covered by a layer of reflective tape 341. A light source 349 (herein an LED) is supported in housing 343 and projects light towards the reflective surface 341. Housing 343 also includes a light sensing element 351 (here a phototransistor) which receives the light from the LED 349 reflected off of surface 341 at the point of reflection 368. Note that reflective object sensors having housings supporting a LED and a phototransistor and designed to be used in conjunction with reflective surfaces for various purposes are available from Altron, Inc. in Carrollton, Tex. LED 349 is disposed to project light at an angle 371 with respect to vertical axis 369 which is perpendicular to reflective surface 341 at the point of reflection 368. Transistor 351 is disposed at an angle 373 with respect to this axis 369. The sensor 335 is geometrically configured so that angle 371 equals angle 373. Bolt 347 can be loosened to adjust the housing 343 vertically to achieve the required distance D between the bottom 344 of housing of 343 and the top 342 of pipe 337 so that angle 371 equals angle 373 and the light emitted by LED 349 is fully reflected by surface 341 to phototransistor 351 in dry conditions. Should condensation begin to form upon pipe 337 at the point of reflection 368, then the reflection of light from LED 349 will be impeded and the light will only be partially reflected to phototransistor 351. Circuitry associated with phototransistor 351 monitors the output of phototransistor 351 and thus distinguishes between fully reflected and partially reflected light. This circuitry is shown in FIG. 5. As shown in FIG. 5, a current limiting resistor 353 limits the current to LED 349 while variable resistor 355 is adjusted to linearize the output of phototransistor 351 under varying light conditions. Current output sensing device 357 measures the output of phototransistor 351. When the light from LED 349 is being fully reflected to phototransistor 351, device 357 measures a full scale reading. Once condensation begins to form at reflection point 348 of pipe 337, however, reflection of the light to phototransistor 351 is impeded and its output as measured by device 357 drops. In response to this reduced output of the phototransistor 351, the device 357 first shuts down the coolant pump, and then the entire computer system circuitry. Once the condensation evaporates, the system can either be manually or automatically started. Note that in the presently preferred embodiment the condensation sensor 335 would be installed on one of the coldest pipes of the coolant system, probably the coolant supply manifold 21, in that this would be the first place where condensation would be likely to form.

Having described the presently preferred embodiment of the cooling system and condensation sensor, many modifications and variations thereof will be obvious to those skilled in the art, and accordingly, the invention is intended to be limited only by the scope of the appended claims.

We claim:

1. In a cooling system for a computer installed in an environment, a condensation sensor, comprising:
   a light source;
   a light reflective surface;
   a light detector mounted for receiving light from said light source reflected off of said light reflective surface, said light being fully reflected from said reflective surface to said light detector in dry conditions and only partially reflected from said reflective surface to said light detector in wet conditions wherein water has condensed on said reflective surface; and
   circuitry associated with said light detector to distinguish between said fully reflected light and said partially reflected light, said circuitry disabling said coolant system and said computer when said light is only partially reflected due to condensation on said reflected surface.

2. The cooling system of claim 1, wherein said reflective surface comprises reflective tape applied to a conduit of said cooling system.

3. The cooling system of claim 2, wherein said light source comprises a light emitting diode and said light sensing means comprises a phototransistor.

4. The cooling system of claim 1 further comprising a means for estimating the dew point of said environment and means for comparing said dew point with the temperature of said cooling system to generate a temperature differential value, further comprising a means for controlling said cooling system in response to said temperature differential value to maintain said system temperature above said dew point temperature.

* * * * *